United States Patent [19]

Greenberger

[11] Patent Number: 4,794,559

[45] Date of Patent: Dec. 27, 1988

[54] CONTENT ADDRESSABLE SEMICONDUCTOR MEMORY ARRAYS

[75] Inventor: Alan J. Greenberger, Berkeley Heights, N.J.

[73] Assignee: American Telephone and Telegraph Company, AT&T Bell Laboratories, Murray Hill, N.J.

[21] Appl. No.: 628,165

[22] Filed: Jul. 5, 1984

[51] Int. Cl.[4] .................. G11C 15/04; G11C 11/24
[52] U.S. Cl. ................................. 365/49; 365/201; 365/230
[58] Field of Search .............. 365/49, 189, 230, 233, 365/201; 340/796; 371/21

[56] References Cited

U.S. PATENT DOCUMENTS

| 4,110,842 | 8/1978 | Sarkissian et al. | 365/233 |
| 4,257,110 | 3/1981 | Lamb et al. | 365/49 |
| 4,296,475 | 10/1981 | Nederlof et al. | 365/49 |
| 4,404,653 | 9/1983 | Ruhman et al. | 365/49 |

OTHER PUBLICATIONS

W. A. Crofut et al, "Design Techniques of a Delay-Line Content-Addressed Memory," *IEEE Transactions on Electronic Computers*, vol. EC-15, No. 4, Aug. 1966, pp. 529-534.

T. Kohonen, *Content-Addressable Memories*, 1980, pp. 161-163.

T. Kohonen, *Associative Memory*, 1977, pp. 61-69.

R. M. Lea, "The Comparative Cost of Associative Memory," *The Radio and Electronic Engineer*, vol. 46, No. 10, Oct. 1976, pp. 487-496.

*Primary Examiner*—James W. Moffitt
*Attorney, Agent, or Firm*—David I. Caplan

[57] ABSTRACT

A semiconductor memory circuit is arranged with an ordinary crosspoint row-column array of dynamic capacitor memory storage cells. Word serial content addressing is enabled by adding a separate combinational logic device, only one such device for each entire column bit line, typically comprising a comparator feeding a NAND gate to which masking data can be supplied.

9 Claims, 5 Drawing Sheets

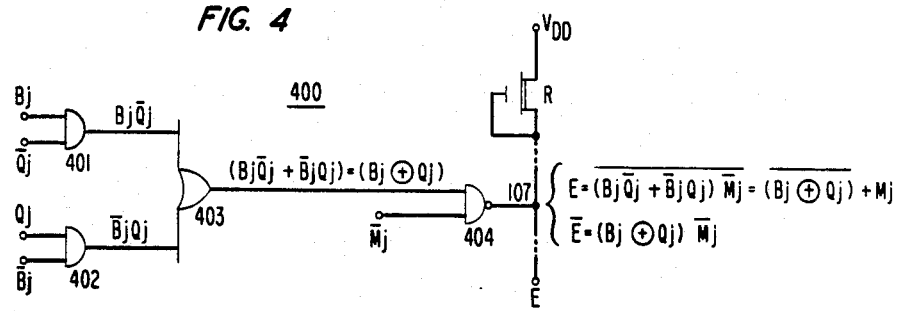
FIG. 4
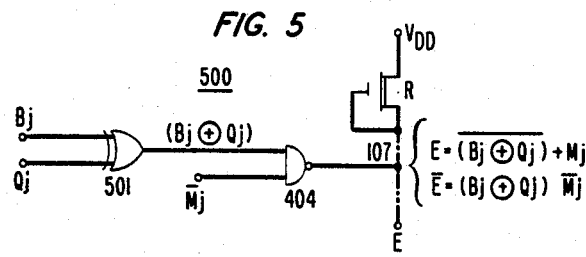
FIG. 5
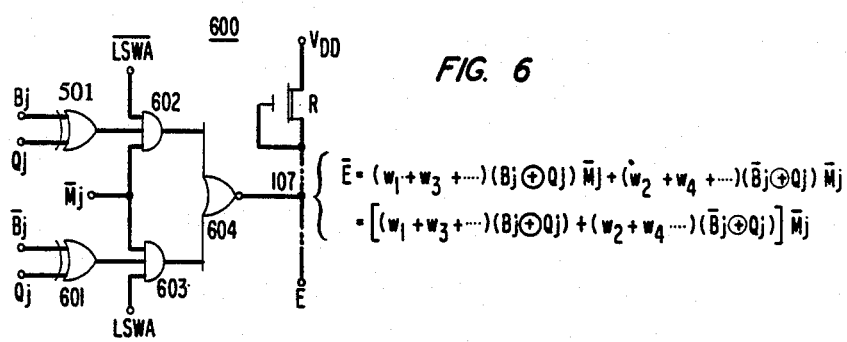
FIG. 6
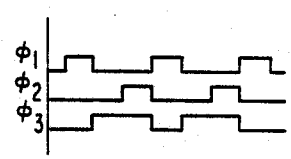
FIG. 9
FIG. 7
(PRIOR ART)
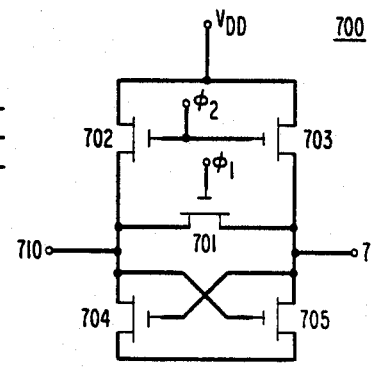

CONTENT ADDRESSABLE SEMICONDUCTOR MEMORY ARRAYS

FIELD OF THE INVENTION

This invention relates to a semiconductor integrated circuits and, more particularly, to semiconductor crosspoint random access memory array circuits that are content addressable.

BACKGROUND OF THE INVENTION

A semiconductor crosspoint memory array circuit is exemplified by a row-column array of binary memory storage cells, that is, a two-dimensional array of such cells integrated in a single semiconductor body (chip), a separate one of such cells located at each crosspoint (intersection) of a row word access line and a column bit access line. Each cell can store a single bit of data, denoted by the conventional binary 1 or 0. For definiteness, assume that the number of row word access lines (wordlines) is n and that the number of bit access lines is m, so that there are n words stored in the array, each word containing m bits. The data stored in all cells on a given wordline forms a string of m bits, composed of the stored binary 1's and 0's, which can be viewed as a complete binary word stored in those cells. The bit stored in each such cell on the given wordline can then be read out by activating the given wordline and detecting the voltage level on each column bit line—a high voltage level corresponding to a stored binary 1, and a low voltage level corresponding to a stored binary 0. Thus the entire word consisting of the string of m bits stored on the given wordline can be read out by activating that wordline and detecting the voltage level on each bit line.

In a semiconductor random access memory (RAM), new data can be written into any cell by activating the wordline on which the cell is located and supplying a suitable voltage (high voltage for storing 1, low voltage for storing 0) to the bit line on which the cell is located. In an integrated circuit, each memory storage cell typically comprises a transistor in series with a storage capacitor, whereby the array of such cells forms a dynamic random access memory (DRAM) array, each cell thus storing either a quantity of charge to represent a stored binary 1 or no charge to represent a stored binary 0. Because of leaking of stored charge from a dynamic memory cell, a refresh operation for regenerating the stored data is perfomed by a separate refresh cycle for each stored word, involving activating the corresponding wordline, sensing and amplifying the corresponding stored charge, and thereby restoring the desired stored charge in all cells of the word. Typically, during a refresh operation, each of the wordlines is activated in sequence, one after the other, until all wordlines have been activated and hence all stored words have been refreshed. Alternatively, each cell can be a flip-flop arrangement of transistors, whereby the array of such cells forms a static random access memory (SRAM) array with no need for any refresh operation.

In many practical applications, it is desired to read out those and only those stored words having a specified portion thereof that matches a test word portion, such test word portion being a string of bits ordinarily containing fewer than m bits. Each of the stored words is called a "record"; the totality of such records forms a "file". For example, consider a memory array for storing a mailing list in which each (complete) stored record has m=512 bits representing in a specified sequence the name, post-office address, and age of a different person. Each such name is stored in a first predetermined portion ("name field") of the record; each such post-office address, in a second predetermined portion ("post-office address field"); and each such age, in a third predetermined portion ("age field"). It is often desired to read out of the mailing list the names and post-office addresses (as well as ages) of all persons having their ages equal to a prescribed value, say 32 (in the decimal system of numbers). A "content addressable" memory arrangement enables such a read out. That is, those and only those (complete) stored records are read out, each of whose respective portion corresponding to age of the person ("age field") matches the binary equivalent of (the prescribed age) decimal 32. Thus, the record of every person of age 32 is selected for read out, and no others. The age portion of each (complete) stored record will be called the "unmasked" portion; the remaining name and post-office address prtion ("name and address field") will be called the "masked" portion. The unmasked portion of each record is sometimes called the "associating field"; the masked portion, the "associated field". Thus, the test word portion is effective to associate the entire contents of every record (name, post-office address, 32) which has a corresponding portion thereof that matches the test word portion. Hence the term "content addressable" or "associative" memory is used to denote such a memory arrangement. It may also be desired to read out of the mailing list the name and post-office address of only one of the many persons of age 32. Again, a content addressable or associative memory can perform such a read out function.

The test word portion itself generally is thus a string containing less than m bits. It can thus be viewed as an incomplete word formed from a complete word (sometimes called the "comparand" or "search argument") having a portion thereof masked by a "masking word", whereby the remaining (unmasked) portion of the comparand forms the test word portion. During content addressing, it is this test word portion that determines which of the records are selected for (associative) read out. The entire masking word itself is composed of a string of m bits, a "1" representing a masking of, and a "0" representing an unmasking of, the corresponding bits in the comparand. (Thus, in the example of the mailing list, the masking word would contain solely 0's in the age field and solely 1's in the remaining name and post-office address fields.) Only the resulting complementary (unmasked) portion of the comparand will then be effective to perform the desired memory content addressing or association function. Thus, those bits in the comparand which are located at bit positions that are masked by the masking word behave as "don't cares"—i.e., do not influence the content addressing process of selecting records for read out.

Usually, as a matter of convenience, the masking word is implemented through its complement, the unmasking word, which is composed of only one (or at most a few) contiguous string(s) of unmasking bits—i.e., binary 1's located at a number of successive contiguous bit positions, and binary 0's located at all the remaining bit positions. In general, however, the unmasking word and hence the unmasked portion of the comparand can be composed of bits that are scattered in any desired way among the various bit positions corresponding to the comparand. Thus, each binary 1 in this unmasking word corrsponds to binary 0 in the masking word and is therefore effective to select a corresponding bit of the test word portion of the comparand, while all the binary 0's in the unmasking word behave as the "don't cares" with respect to the comparand.

In a paper by R. M. Lea entitled "The Comparative Cost of Associative Memory," published in *The Radio and Electronic Engineer*, Vol. 46, (1976) pp. 487–496, at pp. 490–491, an integrated circuit memory array of content addressable memory cells is disclosed. In the circuit, all words that are stored in the cells of the memory array can be simultaneously tested to locate those words whose unmasked portions match the test word. That is, a "word-parallel" search of the entire array can be performed. Each cell in the array comprises a dynamic memory element with four transistors per cell, instead of the more conventional and simple dynamic memory cell comprising a capacitor accessed by a transistor (which is not content addressable). However, the requirement in that circuit for four transistors per cell, as well as an additional requirement of multiple voltage power supplies, causes it to be unduly expensive in terms of cost and size per cell, whereby the total storage capacity of the memory array—i.e., the number of storage cells (and hence records) that can fit on a single semiconductor chip—is undesirably limited.

SUMMARY OF THE INVENTION

This invention involves a semiconductor memory circuit comprising:

(a) a crosspoint bit line-wordline array of dynamic semiconductor memory cells;

(b) means for separately refreshing each of the wordlines;

(c) single equality output line which is connected to each of the bit lines through a separate logic device, a single such device per bit line; and (d) means, responsive to the refreshing, for identifying whether any wordline which is being refreshed stores a word portion that matches a test word portion, including means for developing on the equality output line a logic output state representing whether or not the wordline contains a word portion that matches the test word portion.

Each of the cells advantageously consists essentially of a separate capacitor and a separate transistor through which the capacitor is connected to the corresponding bit line, a control terminal of the transistor being connected to the corresponding wordline. Each of the logic devices advantageously is combinational logic comprising a separate comparator for comparing the logic level of a corresponding bit of the test word portion with the logic level of a corresponding bit line.

The refreshing can be either the sequence of refresh cycles for activating the word access lines (one after the other, or in accordance with any other order of sequence) already ordinarily done for refreshing data in a dynamic memory array, or it can be an extra access cycle for the special purpose of content addressing which happens to refresh the data in the accessed wordline(s).

In another aspect, this invention involves a method for content-addressing a crosspoint bit line-wordline array of dynamic semiconductor memory cells comprising the steps of:

(a) refreshing the cells on any given wordline, and (b) simultaneously with such refreshing, developing a logic output state on an equality output line which is connected to each of the bit lines through a separate combinational logic device, a single such device per bit line, whereby the logic output state on the equality output line represents whether or not the given wordline stores a word portion that matches a test word portion.

In a specific embodiment of the invention, a semiconductor integrated circuit arrangement comprises:

(a) a crosspoint row-column array of semiconductor dynamic binary memory storage cells, the array having a first plurality of column bit access lines, a second plurality of row word access lines, and a separate dynamic binary memory storage cell connected across each crosspoint of a wordline and a bit line, whereby during refresh operation, when any given word access line is activated, each column bit line is supplied with a separate memory bit signal representing the bit and only the bit stored in the storage cell located at the crosspoint of that column bit line and the given wordline;

(b) an output equality line;

(c) a separate combinational logic device associated with each such column bit line, one and only one such device for each such bit line, each such logic device connected for receiving:

(1) a separate test bit signal corresponding to the associated bit line, (2) the complement of such test bit signal, (3) a separate unmasking bit signal corresponding to the associated bit line, (4) the corresponding memory bit signal thus supplied to the associated bit access line during refresh operation, and (5) the complement of such memory signal, each such combinational logic device connected for delivering in response to the refresh operation an output signal to the output equality line which is low only if, when the unmasking bit is high, the test bit does not match the memory bit signal on the associated column bit line.

The equality line is pulled up toward a high logic level by virtue of, for example, being connected to a high level voltage source ($V_{DD}$) through a resistor (R). Accordingly, when the word access line corresponding to the given row is activated a mismatch of at least one test bit signal with the corresponding bit on the given word access line will drive the output equality line low. Thus, a low voltage level on the equality line signifies a mismatch of at least one bit on the given word access line with a corresponding bit of the unmasked portion of a test word. Otherwise, in case of a match, the equality line remains at the high voltage level, signifying the match. When such a match occurs, a detector connected to the equality line then registers a corresponding high voltage level; otherwise, when a mismatch occurs, the detector registers a low voltage level. In this way, only a single combinational logic device, typically having only five transistors, need be added for each entire bit line, regardless of the number of storage cells per bit line, i.e., regardless of the number of word access lines in the array.

Thus, for a storage cell matrix array of n row word access lines and m column bit lines, typically a total of only 5 m transistors need be added for content addressing the array of n×m cells in accordance with the invention. Each memory storage cell advantageously can be a conventional dynamic memory cell containing simply a transistor in series with a storage capacitor. Testing (or "searching") for a match of a test word with each of the stored words, one after the other, can be done, for example, at the same time that each of the word access lines is being accessed for refreshing, likewise one word after the other. Accordingly, instead of the conventional content addressable memory array—where all words in the memory array are simultaneously tested to locate those words whose unmasked portions match the test word ("word parallel search'-')—in this invention, each word in the array is tested in an ordered sequence, typically one word after the other, to see whether the unmasked portion of each such word does or does not match the test word ("word serial search"). That is, the array is tested in a word serial sequence for matching versus mismatching of unmasked word portions relative to the test word.

Each of the stored words represents a "record" in the content addressable memory. The number of refresh cycles thus required to test all the records in the array in this invention would equal the number n of records stored in the array. In case this number n of required refresh cycles would be so large that the testing time would become intolerably long, the memory array can be divided into memory blocks, say p in number, each block thus containing a conveniently smaller number (n/p) of records, each record in each block having the same word access line as a corresponding record in each of the other blocks, and each block having a separate output equality line. Each of the equality lines is then connected to a resolver register that thus records, when a given word access line is activated, which of the blocks has a matching record at the unmasked portion corresponding to the given word access line and which of the blocks has a mismatch thereat. For example, if the resolver register records the binary number (0110 . . . ) in response to the activation of a given word access line, it signifies that the unmasked portion of the corresponding record in the first block mismatches the test word, that of the second block matches, that of the third block matches, that of the fourth block mismatches, etc. Thus, since the entire array of memory blocks has n/p word access lines (each block having n/p words), the entire array can be tested with respect to a given test word during n/p read out cycles. Then the remaining (associated) masked portion of each matching record in each block can be read out (as well as the unmasked portion, i.e., the test word itself, if desired) under the control of the resolver register. That is, the resolver register then determines which of the blocks should be read out as to the masked record portion thereof (as well as unmasked portion, if desired) corresponding to the given word access line. Thus, with the addition to an ordinary dynamic memory array of relatively little extra chip area, a content addressable array is achieved.

BRIEF DESCRIPTION OF THE DRAWING

This invention, together with its features and advantages, may be better understood from the following detailed description when read in conjunction with the drawing in which:

FIG. 4 is a logic diagram of a portion of the circuit shown in FIG. 1;

FIG. 5 is an alternative logic diagram of the portion of the circuit of FIG. 1 that is diagrammed in FIG. 4;

FIG. 6 is a logic diagram of a portion of the circuit shown in FIG. 2;

FIG. 7 is a schematic diagram of another portion of the circuit shown in FIG. 1; FIG. 9 is a timing diagram of clock pulse sequences indicated in FIGS. 1 and 7.

All transistors are typically n-channel MOS enhancement mode, except for transistors 702, 703 (FIG. 7), and those labeled R (FIGS. 1-6, 8) which are typically n-channel MOS depletion (alternatively, p-channel enhancement) mode. Typically, $V_{DD}$ is a voltage of about +5 volts, i.e., the power source of the high logic level of the circuit; $V_{SS}$ is semiconductor substrate ground, i.e., the power source of the low logic level of the circuit.

DETAILED DESCRIPTION

Figure 1:
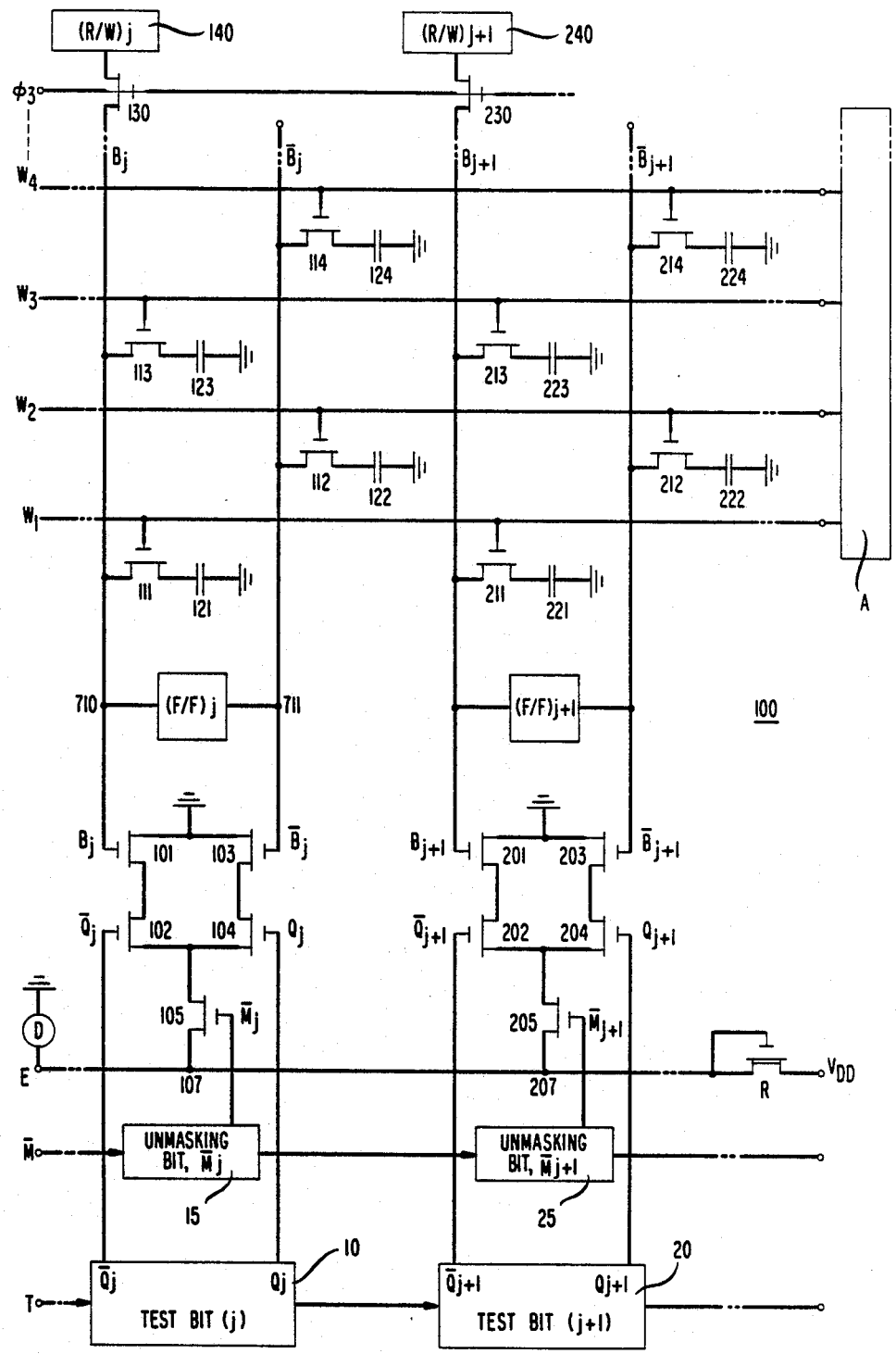
FIG. 1 is a schematic diagram of an integrated circuit content addressable memory array in accordance with a specific embodiment of the invention.

FIG. 1 shows an overall design of a dynamic random access memory circuit 100 that is content addressable in accordance with the invention. The circuit 100 includes a crosspoint array of memory cells, each formed by a transistor connected in series with a capacitor, having a first plurality of word access lines exemplified by $W_1$, $W_2$, $W_3$, $W_4$, . . . and a second plurality of bit lines, exemplified by a j'th bit line $B_j$ folded into its complementary bit line $\overline{B}_j$ and a (j+1)'th bit line $B_{j+1}$ folded into its complementary bit line $\overline{B}_{j+1}$. The purpose of such folded bit lines is to minimize adverse effects due to noise pickup by the bit line, as known in the art. Each of the word access lines $W_1$, $W_2$, $W_3$, $W_4$, . . . is connected to a wordline controller A for activating these wordlines one at a time, for reading, writing, or refreshing the cells, as known in the art. At the crosspoint intersections of odd-numbered word access lines $W_1$ $W_3$, . . . with bit lines . . . $B_jB_{j+1}$ . . . , crosspoint transistors . . . 111, 113, 211, 213 . . . are connected in series with memory storage capacitors . . . 121, 123, 221, 223, . . . , as shown in FIG. 1; and at the crosspoint intersections of even-numbered word access lines $W_2$, $W_4$ . . . with complementary bit lines . . . $\overline{B}_j\overline{B}_{j+1}$ . . . , crosspoint transistors . . . 112, 114, 212, 214 . . . , are connected in series with memory storage capacitors . . . 122, 124, 222, 224, . . . respectively, as also shown. Each word access line (e.g., $W_1$) is connected to the control terminals of all crosspoint transistors (e.g., 111, 211 . . . ) on that wordline. Each bit line—such as $B_j$—is connected to its complementary bit line—such as $\overline{B}_j$—by a flip-flop sense-refresh amplifier (F/F)$_j$ having input terminals 710 and 711, as known in the art and as more fully illustrated in FIG. 7.

Each of the bit lines . . . $B_jB_{j+1}$ . . . , terminates in a separate bit line access transistor . . . 130, 230, . . . having their gate terminals driven by a common clock pulse sequence $\phi_3$. Each of these bit line access transistors is connected to read-write circuitry . . . 140, 240 . . . , also denoted by . . . (R/W)$_j$(R/W)$_{j+1}$ . . . , as known in the art. Thus far, a conventional dynamic random access memory (DRAM) circuit has been described in detail in connection with FIG. 1. In particular, with additional reference to FIG. 7, a selected crosspoint cell (such as the cell located at the intersection of word access line $W_2$ and complementary bit line $\overline{B}_j$) can be read or written as desired by activating the corresponding word access line (such as $W_2$) during a conventional read/write cycle defined by the clock pulse sequence $\phi_3$ (FIGS. 1 and 9) together with sequences $\phi_1$ and $\phi_2$ (FIGS. 7 and 9). Note that during read out cycles the complement of the bit stored in a storage cell connected to a complementary bit line is read by the read-write circuitry, and during write-in cycles the complement of the bit supplied by the read-write circuitry is stored in such a cell, owing to the properties of the flip-flop sense-refresh amplifier connected across each bit line and its complementary bit line.

Typically, there are a total of 512 bit lines in the array, that is, 256 bit lines $B_j$ and 256 complementary bit lines $\overline{B}_j$. Thereby, a single record of 512 bits in length can be stored on each word access line. The number of word access lines can thus be 512 for a 256K random access memory (since $512 \times 512 = 256K$), so that 512 records can be stored, each such record being in the form of a string of 512 bits.

For the purpose of content addressing, the following features are added to the circuit 100: (1) a test bit serial shift register comprising test bit latches ... 10, 20, ... ; (2) an unmasking bit serial shift register comprising unmasking bit latches ... 15, 25, ... ; (3) an output equality line terminating in an output terminal E to which a voltage detector D is connected; (4) combinational logic devices comprising transistors ... 101-105, 201-205, ... terminating on the equality line at terminals ... 107, 207, .... The test bit serial shift register terminates at a terminal T where desired new test bits ... $Q_j$, $\overline{Q}_j$, $Q_{j+1}$, ... can be serially shifted into the test bit latches ... 10, 20, .... The unmasking bit shift register terminates at a terminal $\overline{M}$ where desired new unmasking bits ... $\overline{M}_j$, $\overline{M}_{j+1}$, ... can be serially shifted into the unmasking bit latches ... 15, 25, .... In the combinational logic device comprising transistors 101-105, the source-drain paths of transistors 101 and 102 are mutually connected in series with the source-drain path of transistor 105 thereby forming a path between ground and terminal 107 of the equality line, as are the transistors 103 and 104 thereby forming a parallel path between ground and terminal 107 (with transistor 105 in common). The gate terminal of transistor 101 is connected to the bit line $B_j$, of transistor 103 to the complementary bit line $\overline{B}_j$, of transistor 102 to an output terminal of the test bit latch 10 for supplying a complementary test bit $\overline{Q}_j$, of transistor 104 to an output terminal of the test bit latch 10 for supplying the test bit $Q_j$, and of transistor 105 to an output terminal of the unmasking bit latch 15 for supplying the unmasking bit $\overline{M}_j$. Likewise, a similar logic device comprising transistors 201-205 is connected to the bit lines $B_{j+1}$ and $\overline{B}_{j+1'}$, to the test bit latch 20, and to the unmasking bit latch 25 in a similar fashion.

The logic devices formed by transistors ... 101-105, 201-205, ... each performs the logic function indicated in FIG. 4 for the logic device 400. That is, denoting by $B_j$ and $Q_j$, respectively, the signals on the bit line $B_j$ and the test bit $Q_j$, these signals $B_j$ and $\overline{Q}_j$ are delivered as separate inputs to an AND logic gate 401, $\overline{B}_j$ and $Q_j$ are delivered as separate inputs to another AND logic gate 402, the outputs $B_j\overline{Q}_j$ and $\overline{B}_jQ_j$ of these respective gates are delivered as inputs to an OR gate 403, the output of this OR gate together with the unmasking bit $\overline{M}_j$ are delivered as separate inputs to a NAND gate 404, and the output of this NAND gate is delivered to the terminal 107 on the equality line. The logic function thus performed can be further simplified as a logic device 500 shown in FIG. 5. Here (FIG. 5) the signals $B_j$ and $Q_j$ are delivered as inputs to a single-bit comparator 501, otherwise known as an EXCLUSIVE OR gate, which is the logical equivalent of the arrangement of AND gates 401 and 402 together with OR gate 403 (FIG. 4). At any rate, terminal 107 tends to pull down the voltage at the output equality terminal E ($\overline{E}=0$) if and only if $B_j$ and $Q_j$ differ from each other while $M_j$ is binary 1; that is, the $j$th bit line $B_j$ and its complement $\overline{B}_j$ will bring the voltage on the equality line down to ground if and only if $B_j=\overline{Q}_j(\overline{B}_j=Q_j)$ while the unmasking bit $\overline{M}_j$ is a logic high. In other words, if the unmasked bit line $B_j$ has a signal that mismatches the test bit $Q_j$, then the logic device 400 (FIG. 4) formed by transistors 101-105 pulls the voltage at the terminal 107 and hence at the equality line output terminal E down to ground; otherwise, the logic device 400 has no tendency to pull down the equality line, and thus equality terminal E will remain at $V_{DD}$ above ground unless some other similar logic device (by reason of a similar mismatch on another bit line) tends to pull down another terminal 207, ... and hence E to ground. In case the equality terminal E remains at $V_{DD}$, the voltage detector D registers high; in case the equality terminal is pulled to ground, the detector D registers low.

Of course, the signal on the bit line $B_j$ depends upon which of the word access lines $W_1$, $W_2$, ... is activated. Thus, upon activating a word access line $W_i$ with i an odd integer, the bit line $B_j$ will have a signal on it corresponding to the memory bit stored in that capacitor which is connected through a crosspoint transistor controlled by that word line $W_i$ to the bit line $B_j$, i.e., the memory bit stored at the crosspoint of the i'th row and the j'th column bit line $B_j$. Conversely, upon activating a word access line $W_i$, with i an even integer, the bit line $B_j$ will have a signal on it corresponding to the complement of the memory bit stored in that capacitor which is connected through a crosspoint transistor controlled by that word line $W_i$ to the complementary bit line $\overline{B}_j$. Thus, for odd integer i, upon activating word access line $W_i$, the equality line output terminal E will be pulled to ground if and only if there is at least one mismatch between any unmasked test bit ($Q_j$) of the test word and that memory bit which is stored in the crosspoint cell at the intersection of the i'th row with the corresponding (j'th) bit line ($B_j$), i.e., if and only if there is any mismatch of any bit of the unmasked portion of the test word with the corresponding portion of the i'th stored word. Conversely, for odd integers i, if the equality line output terminal E remains at the high voltage level ($V_{DD}$), then there is a complete match of the unmasked portion of the test word and the corresponding portion of the i'th stored memory word.

For even integers i, the situation is the same except for a reversal of roles of the i'th stored memory word and its complement. Thus, the complement of memory words should be stored in the memory cells on rows having word access line $W_i$ with i an even integer.

Figure 2:
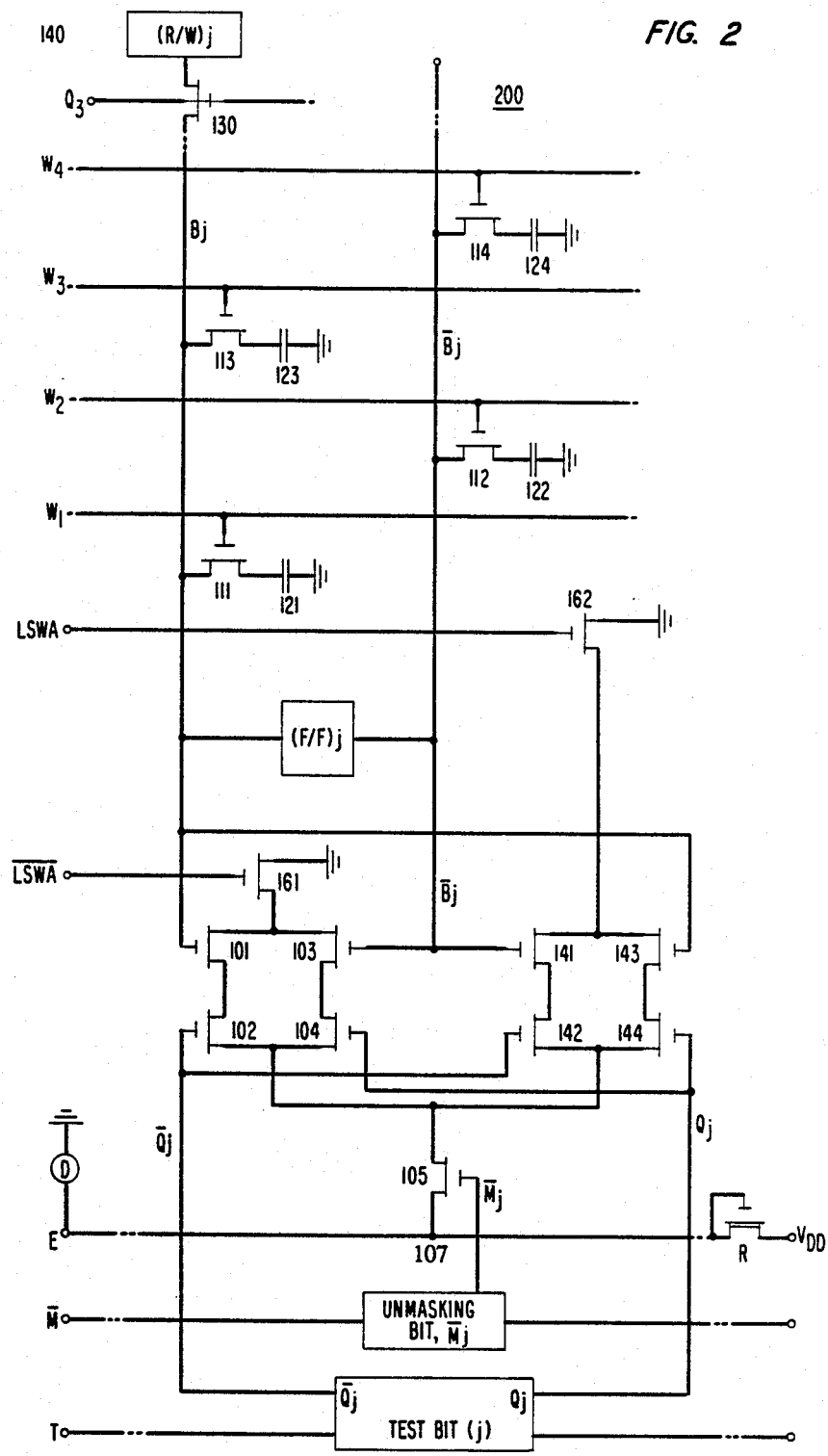
FIG. 2 is a schematic diagram of an illustrative portion of an integrated circuit content addressable memory array in accordance with another specific embodiment of the invention.

To avoid the necessity for storing such complements of memory words (to avoid negative logic word storage format) on such even integer rows, the approach shown in FIG. 2 can be taken. Identical elements in FIGS. 2 and 1 are denoted by the same reference numerals. Here in FIG. 2, the desired logic device is formed by transistors 101-105, 141-144, 161 and 162; and LSWA is the signal corresponding to the least significant bit of the word address, so that LSWA=0 represents addressing a word access line $W_i$ with i an odd integer. The equivalent logic circuit 600 (FIG. 6) shows the corresponding logic function performed by the device; $B_j$ and $Q_j$ are delivered as inputs to the single-bit comparator 501, $\overline{B}_j$ and $Q_j$ are delivered as inputs to another single-bit comparator 601, the unmasking bit $\overline{M}_j$ together with the signal LSWA and the output of the single-bit comparator 501 are delivered as separate inputs to an AND gate 602, the unmasking bit $\overline{M}_j$ together with the signal LSWA and the output of the comparator 601 are delivered as separate inputs to the AND gate 603, the outputs of AND gates 602 and 603 are delivered as separate inputs to a NAND gate 604, and the output of this NAND gate is delivered to the terminal 107 on the equality line. Here, as discussed presently, the memory words in all rows i, whether i is an odd or an even integer, can be stored in positive logic format (rather than in negative logic format in the even-numbered rows as in the circuit 100 of FIG. 1).

When a word access line $W_i$, with i an odd integer, is activated, then $\overline{LSWA}=1$ delivers a high logic level to the AND gate 602 while LSWA=0 delivers a low level to the other AND gate 603. Thus, regardless of the other signals ($B_j$, $Q_j$, $\overline{M}_j$) the AND gate 603 delivers a low level to the NOR gate 604. On the other hand, the AND gate 602 delivers a high logic level to the NOR gate 604 when simultaneously $\overline{M}_j$ is high ($\overline{M}_j$−1) and the output of the single-bit comparator 501 is high ($B_j$ differs from $Q_j$). Since the AND gate 603 delivers a low level, the only way that the NOR gate 604 can have a low output level and hence pull down the equality line at terminal 107, is by having the output of the AND gate 602 deliver a high level, that is the test bit $Q_j$ is unmasked and differs from the j'th bit of the memory word on the i'th row of the memory array. Thus, the equality line is pulled down if and only if there is any mismatch of any unmasked test bit and its corresponding memory bit, i.e., a mismatch of the unmasked test word portion and the corresponding word portion. Similarly, when a word access line $W_i$, with i an even integer, is activated, then the equality line is pulled down if and only if there is any mismatch of any unmasked test bit and the complement of the corresponding stored memory bit. Since two negatives make a positive, the complement (negative) of a complement is unity (positive), and since it is the complement of the memory word that is delivered by the read-write circuits for storage as the memory word on the rows corresponding to row word access lines $W_i$ with i an even integer, therefore, in case of activating such an even-numbered row word access line $W_i$, the equality line terminal E will be pulled down if and only if there is a mismatch between the unmasked test word portion and the (positive logic format of) memory word as originally delivered to and by the read-write (R/W) circuitry.

Whether the circuit 100 (FIG. 1) or the circuit 200 (FIG. 2) is used, in either event the voltage at equality line terminal E will thus be pulled down to ground if and only if there is a mismatch (a "miss") of unmasked test word portion and the corresponding memory word portion on the i'th row being accessed by a given word access line $W_i$; otherwise, if there is a match (a "hit") of unmasked word portion and the corresponding memory word portion on the i'th row thus being accessed, then E will be high. Ordinarily, the output equality line terminal E is connected to logic circuitry (not shown) for enabling subsequent reading of the entire i'th word in case of a match ("hit") but not otherwise. Thus, upon activating $W_1, W_2, W_3, W_4, \ldots$ in sequence, as during a refresh operation, a sequence of output words will be delivered as output to the read-write circuitry . . . 140, 240, . . . (FIG. 1). The unmasked portions of these output words will match the unmasked test word portion, just as is desired of the output from a content addressable memory circuit.

Figure 3:
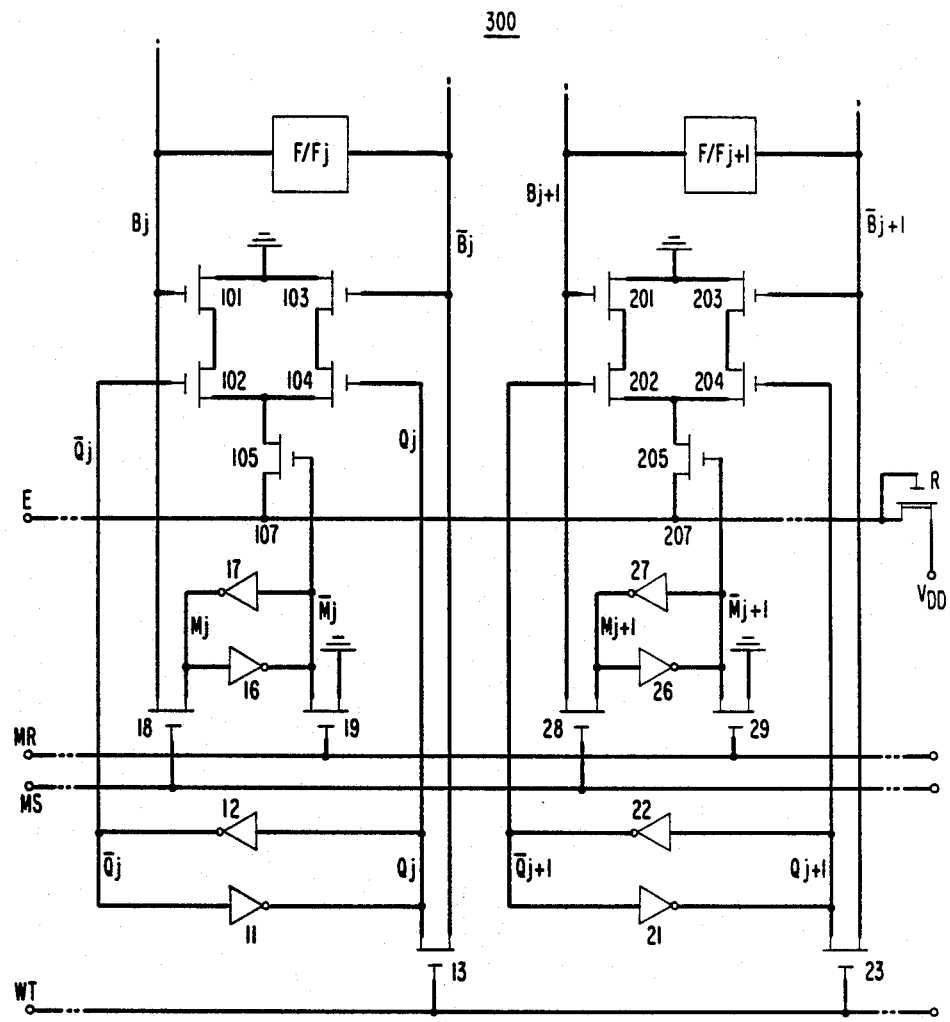
FIG. 3 is a schematic diagram of an illustrative portion of an integrated circuit content addressable memory in accordance with yet another specific embodiment of the invention.
Figure 8:
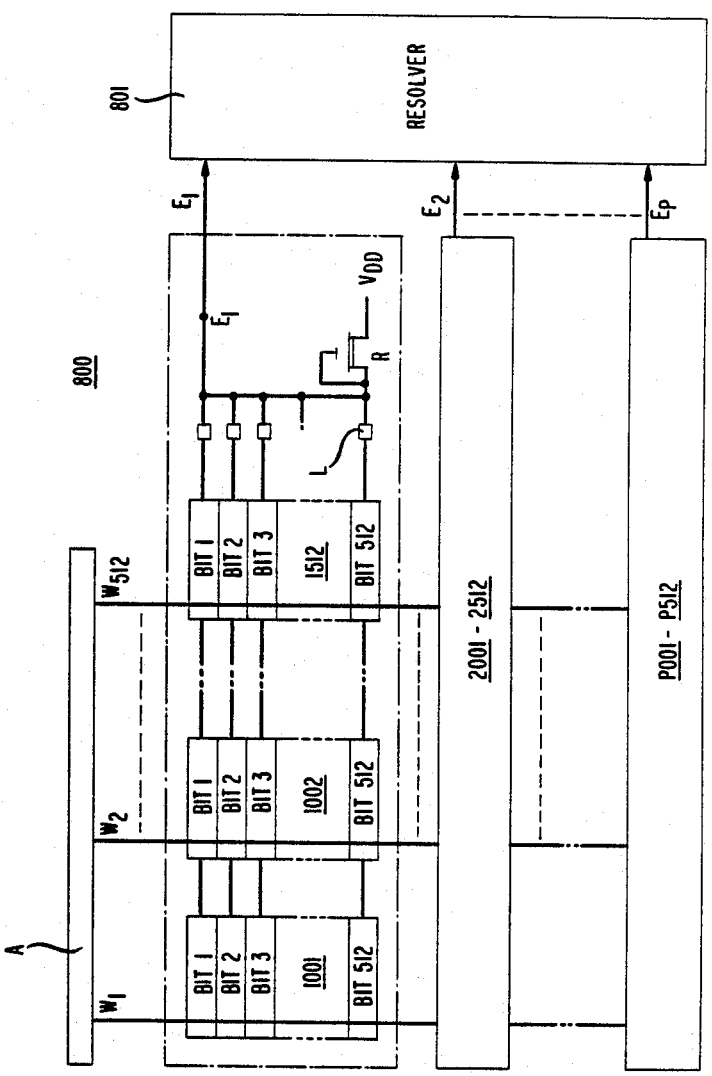
FIG. 8 is a schematic drawing of an integrated circuit content addressable memory array divided into blocks in accordance with yet another specific embodiment of the invention.

To achieve faster capability of writing the test word and the unmasking word, FIG. 3 shows a circuit portion 300 illustrating an alternative embodiment of a lower portion of the circuit 100 (FIG. 1), i.e., the portion below the flip-flops, illustrating an alternative way of delivering each of the test bits $Q_j$ and of the unmasking bits $\overline{M}_j$ to their corresponding latches. Identical elements in FIGS. 3 and 1 are denoted by the same reference numerals. Specifically, instead of delivering fresh new bits to these latches by the shift register technique in the circuit 100, these new bits are written into the latches during a write cycle of the read-write circuits . . . 140, 240 . . . but at a time when no word access line is activated but instead a test latch access line or an unmasking access line is activated, as described presently. In this way, by eliminating the shift register action, faster writing of test words and unmasking words can be achieved.

In the circuit 300 (FIG. 3), the test bit latch 10 of the circuit 100 is replaced with a static latch—formed, for example, by cross-coupled inverters 11 and 12—connected through the source-drain path of a transistor 13 to the complementary bit line $\overline{B}_j$. This static latch provides the test bits $Q_j$ and $\overline{Q}_j$ during content addressing of the memory. The gate terminal of the transistor 13 is connected to a test word access line WT, whereby when this write-test line WT is activated a j'th test bit $Q_j$ is written into this test bit latch, much in the same way as a memory bit would be written into a memory cell at the crosspoint of the i'th row and j'th column when the corresponding word access line $W_i$ would be activated. Instead of a static latch for storing $Q_j$ and $\overline{Q}_j$, a pair of complementary dynamic latches, each in the form of a transistor in series with a capacitor (one connected to $B_j$, the other to $\overline{B}_j$, through the corresponding transistor), could be used in case the test bit is periodically refreshed or otherwise rewritten before it disappears due to capacitor leakage, etc. Note that the test bit outputs $Q_j$ and $\overline{Q}_j$ of the static latch formed by inverters 11 and 12 in the circuit 300 (FIG. 3) are connected to the logic device formed by transistors 101-105 in the same way as are the test bit outputs $Q_j$ and $\overline{Q}_j$ in the circuit 100 (FIG. 1). In effect, a new j'th test bit $Q_j$ is written into this static latch through the complementary bit line $\overline{B}_j$. Similarly, a new (j+1)'th test bit $Q_{j+1}$ is written into a separate static latch formed by cross-coupled inverters 21 and 22 connected to the (j+1)'th complementary bit line $\overline{B}_{j+1}$ through a separate transistor 23 whose gate is also controlled by the test word access line WT, so that this latch can store the (j+1)'th test bit.

The unmasking bit latch 15 in the circuit 100 (FIG. 1) is replaced in the circuit 300 (FIG. 3) with a pair of cross-coupled inverters 16 and 17, which form a static latch for storing the j'th unmasking bit $\overline{M}_j$ and its complement $M_j$. Here $M_j$ in this static latch can be set to a desired binary logic value (1 or 0) by activating a masking word set line MS. This line MS is connected to the gate terminal of a transistor 18 whose source-drain path connects the positive logic terminal of this static latch (for storing $M_j$) to the bit line $B_j$. Moreover, $\overline{M_j}$ can be reset to zero (i.e., $M_j=1$, the j'th bit of the test word is masked) by activating a masking word reset line MR. This masking word reset line MR is connected to the gate terminal of a separate transistor 19 whose source-drain path connects the negative logic terminal of this static latch (for storing $\overline{M_j}$) to ground. Similarly, the unmasking bit latch 25 in the circuit 100 is replaced in the circuit 300 (FIG. 3) with a separate pair of cross-coupled inverters 26 and 27, for storing the (j+1)'th unmasking bit $\overline{M}_{j+1}$ and its complement $M_{j+1}$ as controlled by transistors 28 and 29 together with bit line $B_{j+1}$ in the same way as the unmasking bit latch formed by cross-coupled inverters 16 and 17 is controlled by transistors 18 and 19 together with bit line $B_j$. Thus, this latch for storing the (j+1)'th unmasking bit $M_{j+1}$ can be set to $B_{j+1}$ by activating the masking word set line MS and reset to zero by activating the masking word reset line MR. The advantage here (FIG. 3) over the shift register approach of the latches 10, 20, and 15, 25 in the circuit 100 (FIG. 1) is that in the usual cases, where only a selected relatively few of the unmasking bits $M_j$ are binary 0 (i.e., $\overline{M_j}=1$) while most of the unmasking bits $M_j$ are binary 1 (i.e., $\overline{M_j}=0$), all the unmasking bit latches can be reset to zero by activating MR; and then only the selected unmasking bit latches need be written in accordance with signals supplied by correspondingly selected read-write circuits to the corresponding selected bit lines, by activating $\phi_3$ and MS while the remaining (most) read-write circuits disconnect the remaining (most) bit lines and render them electically floating ("tri-state").

In this way (FIG. 3) the writing of new unmasking words can be significantly faster than when using the shift register approach, especially since now only the selected few (unmasked portion) of the bit lines need be set. Moreover, the writing of new test words can also be significantly faster, because only those bits of the test word which correspond to the unmasked bits of the unmasking word need be written. In addition to faster operation, fewer transistors per column are required. The writing of both new test words and new unmasking words, can also be made significantly still faster by adding a single parallel register (not shown) for storing test words and by adding another single parallel register for storing unmasking words, the bit lines (FIG. 3) can then be written faster than the serial shift registers formed by latches ... 10, 20, ... and by latches ... 15, 25 ... (FIG. 1).

For accommodating a larger number of records, say 512×p, with p substantially greater than unity, the circuits 100, 200, and 300 as thus far described in detail would require an undesirably long time for performing the content addressing by scanning all the word access lines, one after the other. More specifically, it would take 512×p separate refresh cycles to perform the content addressing, each cycle involving an activation of a different one of these word access lines. The circuit 800 shown in FIG. 8 reduces this content addressing time to just 512 such cycles. For convenience and definiteness it is assumed that there are still 512 bits in each record, but it should be understood that the same circuit 800 can be constructed with fewer or more such bits per record. It should also be understood that, only for the sake of clarity in FIG. 8, all control lines and circuitry previously described are omitted so as to highlight the organization of the equality lines $E_1, E_2, \ldots E_p$. By inspection of FIG. 8, it is seen that the entire memory array has been divided into memory array blocks, p in number, each separately connected to a different one of the separate equality lines $E_1, E_2, \ldots E_p$. Each such block can be integrated in a separate semiconductor body, or alternatively more than one of such blocks can be integrated in a separate body. Thus, a first memory block is forced by the top row of 512×512 bits supplied by 512 bits stored in a first record location 1001 located on the first word access line $W_1$ plus 512 bits stored in a second record location 1002 on the second word line $W_2 \ldots$ plus 512 bits stored in a 512'th record location 512 on the 512'th word access line $W_{512}$; the second memory block of 512×512 bits is similarly supplied by record locations 2001, 2002, ... 2512, etc.; and the p'th memory block of 512×512 bits is supplied by record locations p001, p002, ... p512. Each such memory block is connected to a separate one of the equality lines $E_1, E_2, \ldots E_p$ through a total of 512 similar logic devices L in the same way as the memory circuit 100, 200, or 300 is connected to E (FIG. 1, 2, or 3); and in all other respects each one of the memory blocks in the circuit 800 (FIG. 8) is interconnected as the circuit 100, 200, or 300. The test word still has a total of (at most) 512 bits, i.e., the number of bits in a record. Each of the word access lines $W_i$ thus accesses the i'th record in each of the memory blocks, i.e., accesses a total of p records. During content addressing of the circuit 800, when one of the word access lines $W_i$ is activated, then a group (if any) of the equality lines $E_1, E_2, \ldots E_p$ will be pulled down in voltage level depending upon mismatches (if any) of the corresponding records with the unmasked test word portion. More specifically, when $W_i$ is activated, an equality line $E_k$ will be pulled down if and only if the i'th record (accessed by $W_i$) in the k'th memory block mismatches the unmasked test word portion. Thus, upon activating a given word line $W_i$, the i'th record in each memory block is tested for a match versus mismatch, and the resolver 801 receives, simultaneously, the resulting signals on all the equality lines $E_1, E_2, \ldots E_p$ and hence identifies which (if any) of the i'th records in the various memory blocks match the test word in its unmasked portion. The masked portion (as well as the unmasked portion) of each of the matching i'th records can then be read out one after the other in accordance with the information thus brought to the resolver 801, as known in the art. Basically, the resolver performed the function of a multiple match resolver register and controller. By activating the word access lines $W_1, W_2, \ldots W_{512}$, one after the other (i.e., sequentially scanning the word access lines) the entire array of 512p word locations can thus be content addressed, one word access line at a time (word serial content addressing).

Although the invention has been described in terms of specific embodiments, various modifications can be made without departing from the scope of the invention. For example, in FIG. 1, the transistor 105 can be connected between ground and the transistors 101 and 103 while the transistors 102 and 104 are connected to the terminal 107. In case a fixed masked bit portion (e.g., a bit line $B_j$) of the memory array is never to be content addressed, then such a bit portion need not be connected through any combinational logic device to the equality line, and thus the corresponding logic device (e.g., transistors 101-105) together with the corresponding unmasking bit latch (e.g., 15) and the corresponding test bit latch (e.g., 10) can all be omitted for each of the bit lines corresponding to the fixed masked bit portion.

What is claimed is:

1. A semiconductor memory circuit comprising:
   (a) a crosspoint bit line-wordline array of dynamic semiconductor memory cells for storing data, a separate complementary bit line for each bit line, a plurality of cells on each bit line and a plurality of cells on each complementary bit line;
   (b) means for separately activating each of the wordlines;
   (c) a single equality output line which is connected to each of the bit lines through a separate logic device, one and only one such device for each bit line plus the complementary bit line; and
   (d) means, responsive to the data stored in the cells, for identifying whether any wordline which is being activated stores a word portion that matches a test word portion, including means for developing on the equality output line a logic output state representing whether or not the wordline contains a word portion that matches the test word portion.

2. The array of claim 1 in which each of the cells consists essentially of a separate capacitor and a separate transistor through which the capacitor is connected to the corresponding bit line, a control terminal of the transistor being connected to the corresponding wordline.

3. The array of claim 1 in which each such logic device is combinational logic containing at most two single-bit comparators for comparing the logic level of a corresponding bit of the test word portion with the logic level of the corresponding bit line or of the corresponding complementary bit line.

4. The array of claim 3 in which each of the cells consists essentially of a separate capacitor and a separate transistor through which the capacitor is connected to the corresponding bit line, a control terminal of the transistor being connected to the corresponding wordline.

5. A semiconductor integrated circuit arrangement comprising:
   (a) a crosspoint random access row-column array of semiconductor dynamic binary memory storage cells, the array having a plurality of column bit access lines, a separate complementary bit line for each of the bit access lines, a plurality of row word access lines, a separate such dynamic binary memory storage cell connected across each crosspoint of one of the word lines and one of the bit access lines, and a separate such cell connected across each crosspoint of one of the word lines and one of the complementary bit lines, whereby during refresh operation, when a given word access line is activated, each column bit access line is supplied with a separate memory bit signal representing the bit and only the bit stored in the storage cell located at the crosspoint of that column bit access line or of its complementary bit line and the given wordline;
   (b) an output equality line;
   (c) separate sense-refreshed means connected across each such column bit access line and its complementary bit line;
   (d) a separate combinational logic device associated with each such column bit line together with its complementary bit line, one and only one such device for each such bit line plus its complementary bit line, each such logic device connected for receiving:
      (1) a separate test bit signal corresponding to the associated bit line,
      (2) the complement of such test bit signal,
      (3) a separate unmasking bit signal corresponding to the associated bit line,
      (4) the corresponding memory bit signal thus supplied to the associated bit access line during the refresh operation, and
      (5) the complement of such memory signal; and each such combinational logic device connected for delivering an output signal to the output equality line which is low only if, when the unmasking bit is high, the test bit does not match the memory bit signal on the associated column bit line.

6. The circuit of claim 5 in which each such combinational logic includes at most two single-bit comparators for comparing the logic levels of the test bit and its associated bit line or its associated complementary bit line.

7. A semiconductor integrated memory circuit comprising:
   (a) a plurality of memory blocks, each memory block being a crosspoint array in accordance with the array of paragraph (a) of claim 5, each of the plurality of word access lines for each block being an extension of the corresponding word access line of all the other blocks;
   (b) a plurality of separate output equality lines equal to the number of memory blocks, each such equality line being associated with a different one of the memory blocks; and
   (c) a resolver, to which all the equality lines are connected, for detecting and registering the resulting signal level on each of the equality lines.

8. A semiconductor integrated circuit arrangement comprising:
   (a) a crosspoint random access row-column array of semiconductor dynamic capacitor binary memory storage cells, the array having a plurality of column bit access lines, a separate complementary bit line for each of the bit access lines, a plurality of row word access lines, and a separate such dynamic binary storage cell connected across each crosspoint of a word line and a bit access line, and another separate such cell connected across each crosspoint of a word line and a complementary bit line, whereby during refresh operation, when a given word access line is activated, each column bit access line is supplied with a separate memory bit signal representing the bit and only the bit stored in the storage cell located at the crosspoint of that column bit line or its complementary bit line and the given wordline;
   (b) an output equality line;
   (c) separate sense-refresh means connected across each such column bit line access line and its complementary bit line;
   (d) a separate combinational logic device associated with each such column bit line and its complementary bit line, one and only one such device for each such column bit access line, each such logic connected for receiving:
  (1) a separate test bit signal corresponding to the associated bit line,
  (2) the complement of such test bit signal,
  (3) a separate unmasking bit signal corresponding to the associated bit line,
  (4) the corresponding memory bit signal thus supplied to the associated bit line during the refresh operation, and
  (5) the complement of such memory signal; and
each such combinational logic connected for delivering an output signal to the output equality line which is low if and only if, when the unmasking bit is high, the test bit does not match the memory bit signal on the associated column bit line.

9. The circuit of claim 8 in which each combinational logic device consists essentially of:

a first transistor whose gate terminal is connected for receiving the unmasking bit signal and whose source-drain path is connected in series with two parallel branches,
one of the branches consisting essentially of second and third transistors whose source-drain paths are connected in series with each other, the gate terminal of the second transistor being connected for receiving the memory bit signal, and the gate terminal of the third transistor being connected for receiving the complement of the test bit signal,
the other of the branches consisting of fourth and fifth transistors whose source-drain paths are connected in series with each other, the gate terminal of the fourth transistor being connected for receiving the complement of the memory bit signal, and the gate terminal of the fifth transistor being connected for receiving the test bit signal.

* * * * *